(12) United States Patent
Glidden, IV et al.

(10) Patent No.: US 9,380,703 B2
(45) Date of Patent: Jun. 28, 2016

(54) CARRIER BOARD FOR ATTACHMENT OF INTEGRATED CIRCUIT TO CIRCUIT BOARD

(71) Applicant: Raytheon Company, Waltham, MA (US)

(72) Inventors: Robert M. Glidden, IV, Torrance, CA (US); Clay Johnson, Annaheim Hills, CA (US); Michael H. Mikasa, Diamond Bar, CA (US)

(73) Assignee: RAYTHEON COMPANY, Waltham, MA (US)

( * ) Notice: Subject to any disclaimer, the term of this patent is extended or adjusted under 35 U.S.C. 154(b) by 484 days.

(21) Appl. No.: 13/771,239

(22) Filed: Feb. 20, 2013

(65) Prior Publication Data

US 2014/0233201 A1    Aug. 21, 2014

(51) Int. Cl.
H05K 7/00 (2006.01)
H05K 1/14 (2006.01)
H05K 1/02 (2006.01)
H05K 3/00 (2006.01)

(52) U.S. Cl.
CPC .............. *H05K 1/141* (2013.01); *H05K 1/0204* (2013.01); *H05K 3/0061* (2013.01); *H05K 2201/049* (2013.01); *H05K 2201/09072* (2013.01); *H05K 2201/10356* (2013.01); *H05K 2201/10409* (2013.01)

(58) Field of Classification Search
USPC ......... 361/763–764, 782–784, 792–795, 803, 361/700–710, 767–774, 760
See application file for complete search history.

(56) References Cited

U.S. PATENT DOCUMENTS

| | | | | |
|---|---|---|---|---|
| 5,012,386 | A * | 4/1991 | McShane | H01L 23/057 165/185 |
| 5,485,143 | A * | 1/1996 | Keniston | 340/568.7 |
| 5,856,911 | A * | 1/1999 | Riley | G06F 1/203 174/16.3 |
| 6,201,706 | B1 * | 3/2001 | Gustavsen et al. | 361/753 |
| 6,559,388 | B1 | 5/2003 | Kresge et al. | |
| 6,625,028 | B1 * | 9/2003 | Dove | H01L 23/13 165/185 |
| 7,433,192 | B2 * | 10/2008 | Bambridge | H01L 23/13 257/E23.004 |
| 2007/0057364 | A1 * | 3/2007 | Wang et al. | 257/701 |
| 2010/0051322 | A1 * | 3/2010 | Kim et al. | 174/250 |
| 2010/0210048 | A1 * | 8/2010 | Urano | H01L 33/40 438/26 |
| 2011/0198662 | A1 * | 8/2011 | Lin | H01L 21/486 257/99 |
| 2011/0210436 | A1 * | 9/2011 | Chow et al. | 257/686 |

* cited by examiner

*Primary Examiner* — Tuan T Dinh
(74) *Attorney, Agent, or Firm* — Cantor Colburn LLP

(57) ABSTRACT

An electronics system includes a main circuit board; main circuitry located on the main circuit board; a carrier board located on top of the main circuit board; an integrated circuit (IC) located on the carrier board, wherein the IC is electrically connected to the main circuitry on the main circuit board; and a layer of adhesive located between the carrier board and the main circuit board.

18 Claims, 3 Drawing Sheets

CARRIER BOARD FOR ATTACHMENT OF INTEGRATED CIRCUIT TO CIRCUIT BOARD

STATEMENT REGARDING FEDERALLY SPONSORED RESEARCH OR DEVELOPMENT

This invention was made with government support under contract number W15P7T-11-D-C604, awarded by the Department of Defense. The government has certain rights in the invention.

BACKGROUND

This disclosure relates generally to electronics systems, and more particularly to a carrier board for attachment of an integrated circuit (IC) to a circuit board.

An electronics system may include a plurality of interconnected electronic components, such as ICs, that are mounted on a circuit board and a chassis. The electronic components may be connected to one other by electrical connections such as solder joints. During operation of the electronics system, heat is produced by the various electronic components, which may cause expansion and contraction (i.e., thermal cycling) of the materials that comprise the electronics system. The materials that comprise the chassis, circuit board, and electronic components used in an electronics system may have significant mismatches in their coefficients of thermal expansion (CTE) relative to one another. This CTE mismatch may result in stress fractures in solder joints during thermal cycling that occurs during operation of the electronics system, which may cause failure of the electronics system. For example, an IC may be connected by, for example, screws, to an aluminum chassis, and also soldered to a circuit board in an electronics system. During operation of such an electronics system, the aluminum chassis may expand at a different rate than the circuit board, putting stress on the IC and potentially breaking the solder joints. Various heat dissipation techniques may be used to offset the effects of CTE mismatch; however, such heat dissipation techniques may not be sufficient to prevent damage to an electronics system due to CTE mismatch and thermal cycling.

SUMMARY

In one aspect, an electronics system includes a main circuit board; main circuitry located on the main circuit board; a carrier board located on top of the main circuit board; an integrated circuit (IC) located on the carrier board, wherein the IC is electrically connected to the main circuitry on the main circuit board; and a layer of adhesive located between the carrier board and the main circuit board.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of an electronics system including a carrier board for attachment of an IC to a circuit board are provided, with exemplary embodiments being discussed below in detail. Solder joints between an IC and electronics on a main circuit board in an electronics system may be eliminated by attachment of the IC to a relatively small carrier board that is sized to accommodate the IC. This carrier board is bonded to the main circuit board of the electronics system using a layer of an adhesive, which provides support for the carrier board while maintaining flexibility over a wide range of temperatures. The adhesive may comprise any appropriate flexible adhesive material, such as an adhesive tape, foam (such as a closed-cell foam), or cement, in various embodiments. The IC on the carrier board is electrically connected to the electronics on the main circuit board of the electronics system using bridging wires that allow movement during thermal cycling of the electronics system. The bridging wires may comprise coaxial cable in some embodiments. Use of the carrier board prevents failure in the electronics system by limiting solder joints to bonding between components that have comparable CTEs (i.e., components located on the main circuit board) and providing a flexible interface between components having differing CTEs (i.e., between the IC on the carrier board and components on the main circuit board). The IC and carrier board, main circuit board, and chassis may therefore each expand and contract at different rates during thermal cycling of the electronics system without damage to the electronics system, as there are no solder joints present between the IC and main circuit board that may be damaged during thermal cycling.

The carrier board allows an IC to be incorporated into an electronics system without a redesign of the IC or its leads, as the carrier board is inserted between the leads of the IC and the main circuit board after the IC is fabricated. An IC may have multiple associated carrier boards; the multiple carrier boards may each be located underneath one or more respective leads of the IC so as to support the leads. The bridging wires are connected to the leads of the IC on top of the carrier board, ensuring a relatively short connection between the bridging wires and the IC leads. An IC having flat leads may be used in conjunction with the carrier board. In some embodiments, a carrier board may hold one or more electrical components in addition to the IC, such as resistors and/or capacitors. The IC, and, in some embodiments, the one or more additional electrical components, may be connected to the carrier board by soldering. The IC may also be attached to the chassis of the electronics system using, for example, screws. The IC may comprise a power amplifier IC in some embodiments, and the electronics system may comprise a radio transceiver system.

Figure 1:
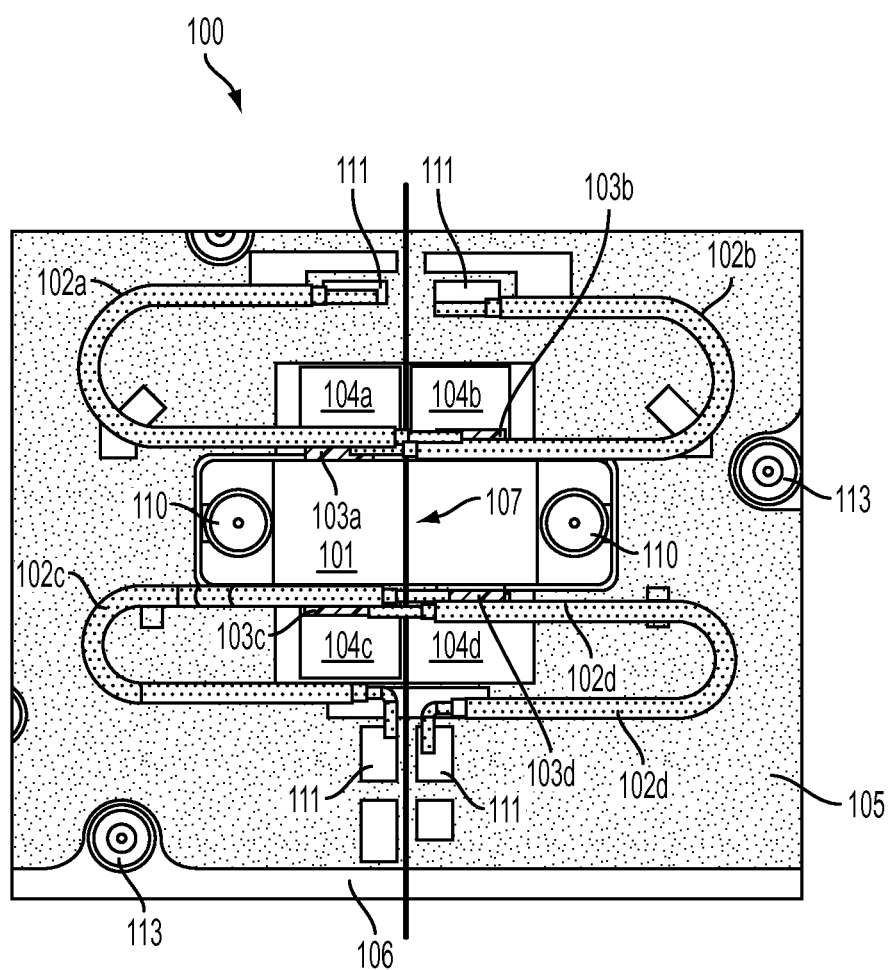
FIG. 1 illustrates a top view of an embodiment of an electronics system including a carrier board for attachment of an IC to a circuit board.

FIG. 1 illustrates a top view of an embodiment of an electronics system 100 including a carrier board 104 for attachment of an IC 101 to a main circuit board 105. Electronics system 100 includes a main circuit board 105 mounted onto a chassis 106 by screws 113. Main circuitry 111 is located on the main circuit board 105 and may comprise any appropriate electrical components. An IC 101 is also attached to the chassis 106 via screws 110. The IC comprises an interface that includes leads 103*a-d*. Leads 103*a-d* as shown in electronics system 100 comprise flat leads. Carrier boards 104*a-d* are located underneath respective leads 103*a-d* of the IC 101. The leads 103*a-d* of the IC 101 may be soldered to their respective carrier boards 104*a-d*. The carrier boards 104*a-d* are each connected to the main circuit board 105 by a layer of a flexible adhesive, which is located directly underneath carrier boards 104*a-d* and is discussed in further detail below with respect to FIGS. 2 and 3. The leads 103*a-d* of the IC 101 are electrically connected to the main circuitry 111 located on the main circuit board 105 via bridging wires 102*a-d*. Bridging wires 102*a-d* and the layers of adhesive located underneath carrier boards 104*a-d* provide a flexible interface between the IC 101 and the main circuitry 111 on the main circuit board 105. In various embodiments, the main circuit board 105 and the carrier boards 104*a-d* may comprise any appropriate circuit board material, such as a fiberglass epoxy, and the chassis 106 may comprise aluminum. The bridging wires 102*a-d* may comprise coaxial cable in some embodiments. The IC 101 may comprise a power amplifier IC in some embodiments, and the electronics system 100 may comprise a radio transceiver system in some embodiments. Electronics system 100 of FIG. 1 (and also FIGS. 2-3, discussed below) is shown for illustrative purposes only; an electronics system may include any appropriate number and configuration of carrier boards in association with an IC. Further, any appropriate number of leads of an IC may be located on a single carrier board in various embodiments. In further embodiments, a carrier board may include additional circuitry, including any appropriate number and/or type of electronic components such as resistors or capacitors, in various embodiments; in such embodiments, the additional circuitry may be electrically connected to the IC via solder joints located on the carrier board.

Figure 2:
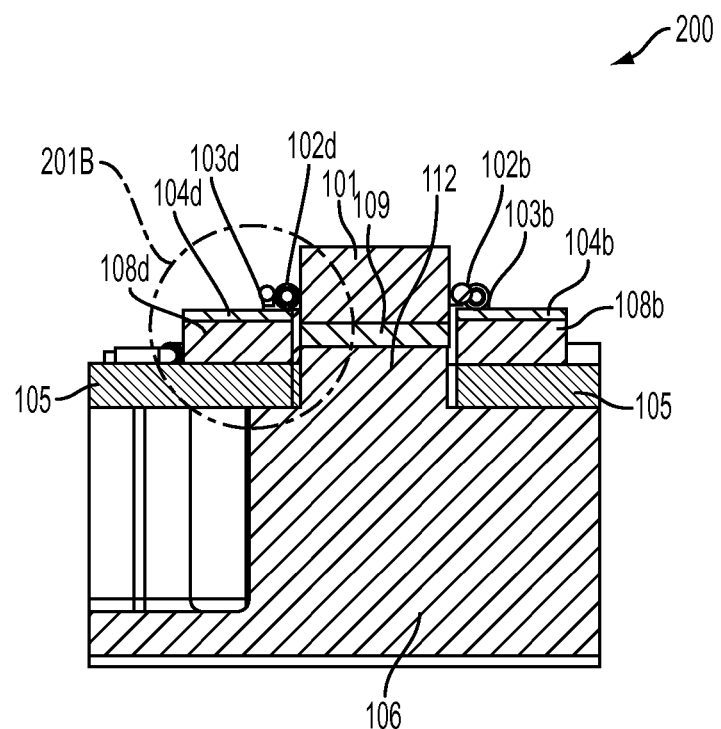
FIG. 2 illustrates a cross-sectional view of an embodiment of an electronics system including a carrier board for attachment of an IC to a circuit board.

FIG. 2 illustrates a cross-sectional view 200 of the electronics system 100 including a carrier boards 104*b* and 104*d* for attachment of an IC 101 to a main circuit board 105; the cross-sectional view shown 200 in FIG. 2 is along line 107 that is shown in FIG. 1. Carrier boards 104*b* and 104*d* are attached to main circuit board 105 via layers of adhesive 108*b* and 108*d*, which may comprise any appropriate flexible adhesive material, for example, a tape, a foam (such as a closed-cell foam), or a cement. Respective layers of adhesive (referred to as 108*a* and 108*c*, not shown) are also located between carrier boards 104*a* and 104*c* (shown in FIG. 1) and main circuit board 105. A flange 109 of the IC 101 is located on a raised portion 112 of chassis 106; the raised portion 112 of chassis 106 extends through a hole in the main circuit board 105 to the flange 109. Leads 103*b* and 103*d* of IC 101 are soldered to their respective carrier boards 104*b* and 104*d*, and are also electrically connected to respective bridging wires 102*b* and 102*d*. Because the connection between IC 101 and the main circuitry 111 on the main circuit board 105 is made via the carrier boards 104*a-d*, the layers of adhesive 108*a-d*, and the bridging wires 102*a-d*, the connection is flexible and moves with the thermal cycling of the electronics system 100.

Figure 3:
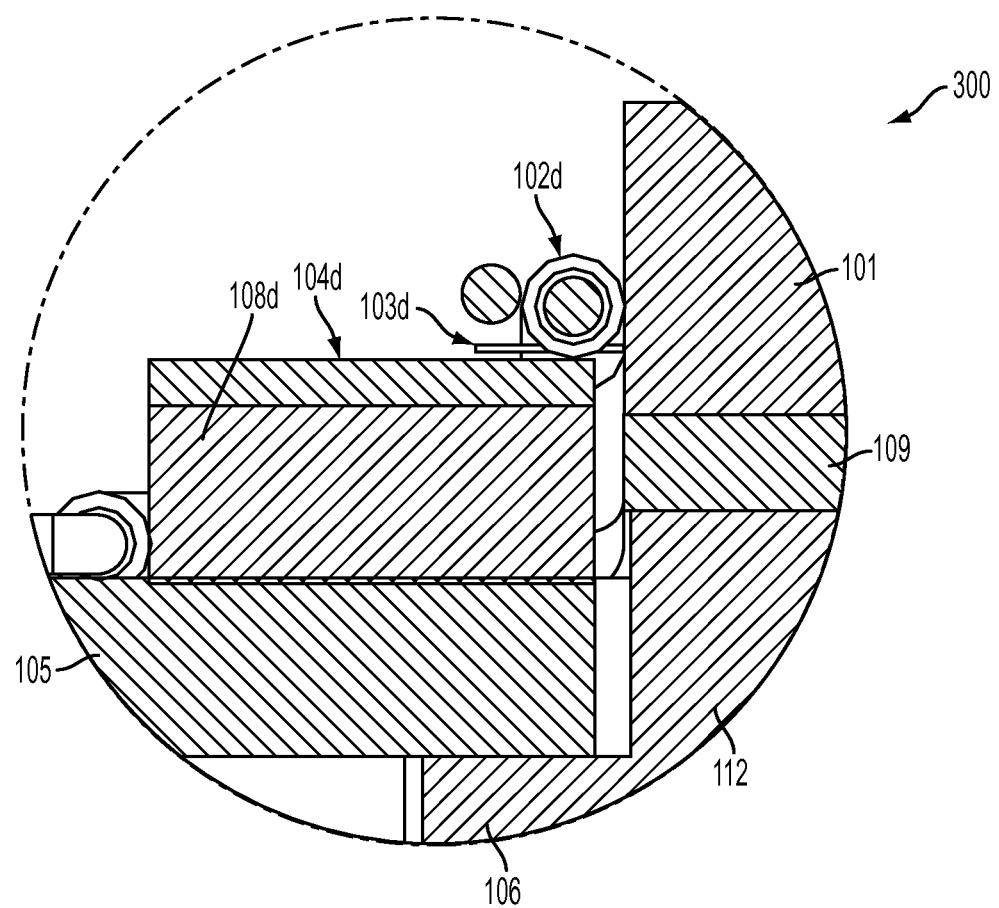
FIG. 3 illustrates another cross-sectional view of an embodiment of an electronics system including a carrier board for attachment of an IC to a circuit board.

FIG. 3 illustrates another cross-sectional view 300 of the electronics system 100 including a carrier board 104 for attachment of an IC 101 to a main circuit board 105; the cross-sectional view shown 300 in FIG. 2 corresponds to circle 201 that is shown in FIG. 2. Carrier board 104*d* is mounted to main circuit board 105 via a layer of adhesive 108*d*, which may comprise any appropriate flexible adhesive material, for example, a tape, a foam (such as a closed-cell foam), or a cement. Lead 103*d* of IC 101 is soldered to its respective carrier board 104*d*, and are also electrically connected to bridging wire 102*d*, which provides the electrical connection between IC 101 and main circuitry 111 on main circuit board 105. Because the connection between IC 101 and the main circuit board 105 is made via the carrier boards 104*a-d*, the layers of adhesive 108*a-d*, and the bridging wires 102*a-d*, the connection is flexible and moves with the thermal cycling of the electronics system 100.

The technical effects and benefits of exemplary embodiments include providing a flexible connection between electronic components in an electronics system that includes materials having differing CTEs.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. An electronics system comprising:
a main circuit board;
main circuitry located on the main circuit board;
a carrier board located on top of the main circuit board;
an integrated circuit (IC), wherein a main portion of the IC is located adjacent to the carrier board, such that the main portion of the IC is not located on top of the carrier board, and wherein a lead of the IC is extends from the main portion of the IC over the carrier board such that the lead is located on top of the carrier board, wherein the lead of the IC on the carrier board is electrically connected to the main circuitry on the main circuit board via a bridging wire that extends from the carrier board to the main circuitry on the main circuit board; and
a layer of adhesive located between the carrier board and the main circuit board.

2. The electronics system of claim 1, wherein the bridging wire moves during thermal cycling of the electronics system.

3. The electronics system of claim 1, wherein the layer of adhesive comprises an adhesive tape.

4. The electronics system of claim 1, wherein the layer of adhesive comprises a foam.

5. The electronics system of claim 1, wherein the layer of adhesive comprises a cement.

6. The electronics system of claim 1, further comprising a chassis, wherein the main circuit board is connected to the chassis via one or more screws.

7. The electronics system of claim 1, further comprising a plurality of carrier boards, each of the plurality of carrier boards corresponding to one or more respective lead of the IC.

8. The electronics system of claim 1, wherein the IC comprises a power amplifier, and wherein the electronics system comprises a radio transceiver.

9. The electronics system of claim 2, wherein the bridging wire comprises coaxial cable.

10. The electronics system of claim 2, wherein the bridging wire is located on top of and soldered to the lead of the IC on the carrier board.

11. The electronics system of claim 6, wherein the chassis comprises a raised portion that extends through a hole in the main circuit board.

12. The electronics system of claim 6, wherein the IC is connected to the chassis via one or more screws that extend through the main circuit board.

13. The electronics system of claim 6, wherein the chassis comprises aluminum.

14. The electronics system of claim 7, wherein each of the plurality of carrier boards is attached to the main circuit board by a respective layer of adhesive.

15. The electronics system of claim 7, wherein each of the leads is located on top of a corresponding carrier board and soldered to a respective bridging wire, and wherein each of the bridging wires electrically connects the bridging wire's respective lead to the main circuitry on the main circuit board.

16. The electronics system of claim 10, wherein the lead of the IC is flat.

17. The electronics system of claim 11, wherein a flange of the IC is located directly on the raised portion of the chassis.

18. An electronics system comprising:
a main circuit board;
main circuitry located on the main circuit board;
a carrier board located on top of the main circuit board;
an integrated circuit (IC) located on the carrier board, wherein the IC is electrically connected to the main circuitry on the main circuit board via a bridging wire that extends from a lead of the IC that is located on the carrier board to the main circuitry on the main circuit board;
a layer of adhesive located between the carrier board and the main circuit board; and
a chassis, wherein the main circuit board is connected to the chassis, wherein the chassis comprises a raised portion that extends through a hole in the main circuit board, and wherein a flange of the IC is located directly on the raised portion of the chassis.

* * * * *